(12) United States Patent
Hanamura et al.

(10) Patent No.: US 7,378,224 B2
(45) Date of Patent: May 27, 2008

(54) METHOD FOR FORMING PATTERN, AND OPTICAL ELEMENT

(75) Inventors: Masaaki Hanamura, Tokyo (JP); Shinji Shiraki, Tokyo (JP); Atsushi Kumano, Tokyo (JP)

(73) Assignee: JSR Corporation, Tokyo (JP)

( * ) Notice: Subject to any disclaimer, the term of this patent is extended or adjusted under 35 U.S.C. 154(b) by 642 days.

(21) Appl. No.: 10/888,985

(22) Filed: Jul. 13, 2004

(65) Prior Publication Data

US 2005/0014100 A1    Jan. 20, 2005

(30) Foreign Application Priority Data

Jul. 14, 2003    (JP)    ............................. 2003-274280

(51) Int. Cl.
*G03F 7/00*    (2006.01)
(52) U.S. Cl. ....................... 430/290; 430/322; 430/324
(58) Field of Classification Search ................ 430/324, 430/322, 290
See application file for complete search history.

(56) References Cited

U.S. PATENT DOCUMENTS

2004/0080264 A1*    4/2004    Ichikawa .................... 313/501

FOREIGN PATENT DOCUMENTS

| EP | 1 296 186 A1 | 3/2003 |
|---|---|---|
| EP | 1 323 742 A2 | 7/2003 |
| JP | 62-25705 | 2/1987 |
| JP | 7-92313 | 4/1995 |
| JP | 11-60803 | 3/1999 |
| JP | 2002-164180 | 6/2002 |

* cited by examiner

*Primary Examiner*—Thorl Chea
(74) *Attorney, Agent, or Firm*—Oblon, Spivak, McClelland, Maier & Neustadt, P.C.

(57) ABSTRACT

There is provided a method for forming a pattern comprising two regions of different refractive indices easily, that is, a method comprising the steps of forming a pattern having a water-shedding oil-shedding region by use of a radiation sensitive resin composition and coating the pattern with a high refractive index resin solution using a solvent having low wettability to the water-shedding oil-shedding region so as to form two regions of different refractive indices.

3 Claims, 3 Drawing Sheets

METHOD FOR FORMING PATTERN, AND OPTICAL ELEMENT

TECHNICAL FIELD

The present invention relates to a method for forming a pattern having two regions of different refractive indices and an optical material having a pattern formed by the method. More specifically, it relates to a method for forming a refractive index pattern which is applied to an optical electronics field and a display field and an optical material comprising the refractive index pattern.

BACKGROUND ART

In the so-called "mass media driven society" at the present time, a refractive-index-distributed optical molded article comprising regions of different refractive indices is in significantly great demand. As examples of such an optical molded article, optical materials such as an optical waveguide which transmits data and microlens arrays for image devices using a semiconductor such as a CCD (Charge Coupled Device) image sensor and a CMOS (Complementary Metal Oxide Semiconductor) image sensor, and an organic EL or liquid crystal display in which a high refractive index portion and a low refractive index portion are formed on a pixel to improve brightness and contrast so as to prevent color leakage between pixels as described in JP-A 2002-164180 (the term "JP-A" as used herein means an "unexamined published Japanese patent application") are known.

An example of a method for coating and forming these two distinct regions having different refractive indices is a method comprising the steps of performing patterning with a radiation sensitive material, applying a radiation sensitive material having a different refractive index thereon and then performing patterning again. Alternatively, the regions can be formed by a method comprising the steps of performing patterning with a radiation sensitive material, applying a material having a different refractive index thereon, and performing surface polishing by a dry etching or CMP (Chemical Mechanical Planarization) process or by using a material which undergoes a change in refractive index through exposure as described in JP-A 62-25705, JP-A 7-92313 and JP-A 11-060803.

However, the methods using two types of radiation sensitive materials and the method involving surface polishing have such problems in terms of processes as complicated processes and high costs and have such a limitation that only materials suited for surface polishing can be used. As for the material whose refractive index is changed by exposure, the maximum refractive index difference is as large as about 0.001 to 0.02, and it is difficult to achieve much wider refractive index distribution for the purposes of preventing an optical loss in an optical waveguide and improving the light converging rate of microlens.

DISCLOSURE OF THE INVENTION

The present invention has been conceived in view of the above circumstance. An object of the present invention is to provide a method for forming a pattern having two regions of different refractive indices easily.

Another object of the present invention is to provide an optical element using a refractive index pattern formed by the above method.

Other objects and advantages of the present invention will be apparent from the following description.

According to the present invention, firstly, the above objects and advantages of the present invention are achieved by a method for forming a pattern having two regions of different refractive indices which comprises the steps of (1) coating a substrate with a radiation sensitive resin composition, (2) exposing a portion of the coating film to radiation to form an exposed coating film, (3) developing the exposed coating film to form a pattern having a first coating film region and a non-coating film region, and (4) coating the above pattern with a resin solution prepared by dissolving a resin that has a higher refractive index than that of the first coating film region in a solvent having low wettability to the first coating film region, thereby converting the non-coating film region into a second coating film region, to form two different refractive index regions which are the first coating film region and the second coating film region.

Further, according to the present invention, secondly, the above objects and advantages of the present invention are achieved by an optical element having a pattern formed by the above method of the present invention.

BEST MODE FOR CARRYING OUT THE INVENTION

Hereinafter, the present invention will be described in detail.

Radiation Sensitive Resin Composition

As the radiation sensitive resin composition used in the first step of the present invention, a water-shedding and oil-shedding resin composition is preferably used. A preferred example of the resin composition is a water-shedding oil-shedding radiation sensitive resin composition comprising:

(I) (IA) a copolymer (hereinafter may be referred to as "component (IA)") of (a-1) hexafluoropropylene, (a-2) an unsaturated carboxylic acid and/or an unsaturated carboxylic anhydride and (a-3) an unsaturated compound other than the components (a-1) and (a-2), (IB) a compound (hereinafter may be referred to as "component (IB)") which generates acid when irradiated with radiation, (IC) a crosslinkable compound (hereinafter may be referred to as "component (IC)"), and (ID) a fluorine-containing organic compound other than the component (IA) (hereinafter may be referred to as "component (ID)").

Component (IA)

The component (IA) used in the water-shedding oil-shedding radiation sensitive resin composition is a copolymer of (a-1) hexafluoropropylene (hereinafter may be referred to as "monomer (a-1)"), (a-2) an unsaturated carboxylic acid and/or an unsaturated carboxylic anhydride (hereinafter may be referred to as "monomer(s) (a-2)"), and (a-3) an unsaturated compound other than the components (a-1) and (a-2) (hereinafter may be referred to as "monomer (a-3)").

Illustrative examples of the unsaturated carboxylic acid and/or unsaturated carboxylic anhydride which are/is the monomer(s) (a-2) constituting the copolymer include unsaturated mono- or di-carboxylic acids such as crotonic acid, maleic acid, 3-butenoic acid, 4-pentenoic acid and itaconic acid; (meth)acrylates of hydroxyfatty acids such as (meth)acryloyloxyacetic acid, 3-(meth)acryloyloxypropionic acid, 2-(meth)acryloyloxypropionic acid and 4-(meth)acryloyloxybutanoic acid; (meth)acrylates of aromatic hydroxycarboxylic acids such as 4-(meth)acryloyloxybenzoic acid, 3-(meth)acryloyloxybenzoic acid, 2-(meth)acryloyloxybenzoic acid, 4-(meth)acryloyloxyphthalic acid, 3-(meth)acryloyloxyphthalic acid, 4-(meth)acryloyloxyisophthalic acid, 5-(meth)acryloyloxyisophthalic acid and 2-(meth)acryloyloxyterephthalic acid; mono(meth)acryloyloxyethyl esters of dicarboxylic acids such as mono(2-(meth)acryloyloxy)ethyl succinate, mono(2-(meth)acryloyloxy)ethyl phthalate, mono(2-(meth)acryloyloxy)ethyl isophthalate, mono(2-(meth)acryloyloxy)ethyl terephthalate, mono(2-(meth)acryloyloxy)ethyl tetrahydrophthalate, mono(2-(meth)acryloyloxy)ethyl tetrahydroisophthalate and mono(2-(meth)acryloyloxy)ethyl tetrahydroterephthalate; carboxyl-group-containing monoalkyl esters of unsaturated carboxylic acids such as monomethyl, monoethyl, monopropyl, mono-i-propyl, monobutyl, mono-sec-butyl and mono-tert-butyl of itaconic acid; and unsaturated carboxylic anhydrides such as maleic anhydride, itaconic anhydride, citraconic anhydride, muconic anhydride, 3-vinyl phthalic anhydride, 4-vinyl phthalic anhydride, methyl-5-norbornene-2,3-dicarboxylic anhydride, 5-norbornene-2,3-dicarboxylic anhydride, 3,4,5,6-tetrahydrophthalic anhydride, cis-1,2,3,6-tetrahydrophthalic anhydride and dimethyltetrahydrophthalic anhydride.

Of these, the unsaturated mono- or di-carboxylic acids are preferably used. Particularly, crotonic acid, maleic acid and itaconic acid are suitably used.

These monomers (a-2) may be used alone or in combination of two or more.

Illustrative examples of the above monomer (a-3) include hydroxyl-group-containing vinyl ethers such as 2-hydroxyethyl vinyl ether, 3-hydroxypropyl vinyl ether, 2-hydroxypropyl vinyl ether, 4-hydroxybutyl vinyl ether, 3-hydroxybutyl vinyl ether, 5-hydroxypentyl vinyl ether and 6-hydroxyhexyl vinyl ether; hydroxyl-group-containing allyl ethers such as 2-hydroxyethyl allyl ether, 4-hydroxybutyl allyl ether and glycerol monoallyl ether; allyl alcohols; alkyl vinyl ethers or cycloalkyl vinyl ethers such as methyl vinyl ether, ethyl vinyl ether, n-propyl vinyl ether, isopropyl vinyl ether, n-butyl vinyl ether, isobutyl vinyl ether, t-butyl vinyl ether, n-pentyl vinyl ether, n-hexyl vinyl ether, n-octyl vinyl ether, n-dodecyl vinyl ether, 2-ethylhexyl vinyl ether and cyclohexyl vinyl ether; perfluoro(alkyl vinyl ethers) or perfluoro(alkoxyalkyl vinyl ethers) such as perfluoro(methyl vinyl ether), perfluoro(ethyl vinyl ether), perfluoro(propyl vinyl ether), perfluoro(butyl vinyl ether), perfluoro(isobutyl vinyl ether) and perfluoro(propoxypropyl vinyl ether); (fluoroalkyl)vinyl ethers or (fluoroalkoxyalkyl)vinyl ethers represented by the formula $CH_2=CH-O-Rf$ (wherein Rf represents an alkyl or alkoxyalkyl group containing a fluorine atom); fluoroolefins such as vinylidene fluoride, chlorotrifluoroethylene, 3,3,3-trifluoropropylene and tetrafluoroethylene; vinyl carboxylates such as vinyl acetate, vinyl propionate, vinyl butyrate, vinyl pivalate, vinyl caproate, vinyl versatate and vinyl stearate; α-olefins such as ethylene, propylene and isobutene; fluorine-containing (meth)acrylates such as 2,2,2-trifluoroethyl(meth)acrylate, 2,2,3,3,3-pentafluoropropyl(meth)acrylate, 2-(perfluorobutyl)ethyl (meth)acrylate, 2-(perfluorohexyl)ethyl(meth)acrylate, 2-(perfluorooctyl)ethyl(meth)acrylate and 2-(perfluorodecyl)ethyl(meth)acrylate; (meth)acrylates such as methyl (meth)acrylate, ethyl (meth)acrylate, n-butyl (meth)acrylate, isobutyl (meth)acrylate, 2-methoxyethyl (meth)acrylate, 2-ethoxyethyl (meth)acrylate and 2-(n-propoxy)ethyl (meth)acrylate; epoxy-group-containing (meth)acrylates such as glycidyl (meth)acrylate, α-ethyl glycidyl (meth)acrylate, α-n-propyl glycidyl (meth)acrylate, α-n-butyl glycidyl (meth)acrylate, 3,4-epoxybutyl (meth)acrylate, 3,4-epoxyheptyl (meth)acrylate and α-ethyl-6,7-epoxyheptyl (meth)acrylate; epoxy-group-containing unsaturated aliphatic compounds such as allyl glycidyl ether, 2-vinyl cyclohexene oxide, 3-vinyl cyclohexene oxide and 4-vinyl cyclohexene oxide; and glycidyl ethers such as vinyl glycidyl ether, 2-vinyl benzyl glycidyl ether, 3-vinyl benzyl glycidyl ether, 4-vinyl benzyl glycidyl ether, α-methyl-2-vinyl benzyl glycidyl ether, α-methyl-3-vinyl benzyl glycidyl ether, α-methyl-4-vinyl benzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene.

Of these monomers (a-3), the alkyl vinyl ethers, cycloalkyl vinyl ethers, vinyl carboxylates, (fluoroalkyl)vinyl ethers and (fluoroalkoxyalkyl)vinyl ethers are suitably used. Of these, methyl vinyl ether, ethyl vinyl ether, n-propyl vinyl ether, isopropyl vinyl ether, tert-butyl vinyl ether, vinyl acetate, vinyl propionate, vinyl butyrate, vinyl pivalate, perfluoroalkyl perfluorovinyl ether and perfluoroalkoxyalkyl perfluorovinyl ether are particularly preferred.

These monomers (a-3) may be used alone or in combination of two or more.

As for the amounts of the monomers constituting the fluorine-containing copolymer in the present invention, the amount of the monomer (a-1) is preferably 20 to 70 wt %, more preferably 25 to 55 wt %, the amount of the monomer (a-2) is preferably 1 to 40 wt %, more preferably 10 to 30 wt % and the amount of the monomer (a-3) is preferably 10 to 70 wt %, based on the total of the monomers (a-1), (a-2) and (a-3).

In this case, when the amount of the monomer (a-1) is smaller than 53 wt %, it is desirable to use a fluorine-containing monomer such as perfluoro(alkyl vinyl ether) or perfluoro(alkoxyalkyl vinyl ether) as the monomer (a-3) so as to increase a fluorine content.

The total content of fluorine in the component (IA) is preferably 40 wt % or higher, more preferably 45 wt % or higher. When the copolymer contains the component (a-1) in the above amount and has a total fluorine content of the above range, a first coating film region which is a cured product obtained by irradiation of radiation is such that a resin residue hardly remains on the water-shedding oil-shedding pattern in a subsequent step of applying a resin solution.

When the amount of the monomer (a-2) is smaller than 1 wt %, the alkali solubility of the polymer is liable to lower, and a satisfactory crosslink density is difficult to attain, so that sensitivity to radiation and a film remaining rate may lower. On the other hand, when this value is larger than 40 wt %, such an inconvenience that a pattern is difficult to form may occur.

Further, when the amount of the monomer (a-3) is within the above range, a composition which is excellent in both developability and pattern formability is obtained.

The component (IA) is produced by radical polymerizing the above monomers (a-1), (a-2) and (a-3) in a polymerization solvent. Further, if necessary, it may be produced by polymerizing these monomers with functional groups in the monomers protected, carrying out a deprotection treatment and then removing protective groups.

Illustrative examples of the polymerization solvent used to produce the component (IA) include alcohols such as methyl alcohol, ethyl alcohol, propyl alcohol and butyl alcohol; cyclic ethers such as tetrahydrofuran and dioxane; aromatic hydrocarbons such as benzene, toluene and xylene; amide-based aprotic polar solvents such as N,N-dimethylformamide and N-methyl-2-pyrrolidone; esters such as ethyl acetate, butyl acetate, isoamyl acetate and ethyl lactate; alkoxy esters such as methyl 3-methoxypropionate, methyl 2-methoxypropionate, ethyl 3-methoxypropionate, ethyl 2-methoxypropionate, ethyl 3-ethoxypropionate and ethyl 2-ethoxypropionate; (di)glycol dialkyl esters such as ethylene glycol dimethyl ether, diethylene glycol dimethyl ether, diethylene glycol diethyl ether, diethylene glycol methylethyl ether, propylene glycol dimethyl ether and dipropylene glycol dimethyl ether; (di)glycol monoalkyl ethers such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether and dipropylene glycol monoethyl ether; glycol monoalkyl ether esters such as propylene glycol monomethyl ether acetate, carbitol acetate, and ethyl cellosolve acetate; and ketones such as cyclohexanone, methyl ethyl ketone, methyl isobutyl ketone and 2-heptanone. These polymerization solvents may be used alone or in combination of two or more.

The proportions of the polymerization solvent and the reaction materials are not particularly limited. The amount of the polymerization solvent is preferably 20 to 1,000 parts by weight based on 100 parts by weight of the total amount of the monomers (a-1), (a-2) and (a-3).

Illustrative examples of a polymerization initiator for radical polymerization include azo compounds such as 2,2'-azobisisobutyronitrile, 2,2'-azobis-(2,4-dimethylvaleronitrile), 2,2'-azobis(4-methoxy-2,4-dimethylvaleronitrile) and organic peroxides or hydrogen peroxides such as benzoyl peroxide, lauroyl peroxide, tert-butyl peroxypivalate and 1,1-bis-(tert-butylperoxy)cyclohexane. When a peroxide is used as the polymerization initiator, the peroxide may be combined with a reducing agent so as to be used as a redox-type polymerization initiator.

The number average molecular weight in terms of polystyrene of the component (IA) is preferably 1,000 to 100,000, more preferably 1,000 to 50,000. When a fluorine-containing copolymer having a number average molecular weight in terms of polystyrene of lower than 1,000 is used, a pattern with a poor shape may be obtained, the film remaining rate of pattern may lower or the heat resistance of a pattern may deteriorate. On the other hand, when the number average molecular weight in terms of polystyrene is higher than 100,000, the coatability of the radiation sensitive resin composition may become poor, its developability may deteriorate or a pattern with a poor shape may be obtained.

Component (IB)

As the compound (acid generating compound) which generates acid when irradiated with radiation, i.e., the component (IB), trichloromethyl-s-triazines, diaryl iodonium salts and triaryl sulfonium salts can be used, for example.

Illustrative examples of the above trichloromethyl-s-triazines include 2,4,6-tris(trichloromethyl)-s-triazine, 2-phenyl-4,6-bis(trichloromethyl)-s-triazine, 2-(4-chlorophenyl)-4,6-bis(trichloromethyl)-s-triazine, 2-(3-chlorophenyl)-4,6-bis(trichloromethyl)-s-triazine, 2-(2-chlorophenyl)-4,6-bis(trichloromethyl)-s-triazine, 2-(4-methoxyphenyl)-4,6-bis(trichloromethyl)-s-triazine, 2-(3-methoxyphenyl)-4,6-bis(trichloromethyl)-s-triazine, 2-(2-methoxyphenyl)-4,6-bis(trichloromethyl)-s-triazine, 2-(4-methylthiophenyl)-4,6-bis(trichloromethyl)-s-triazine, 2-(3-methylthiophenyl)-4,6-bis(trichloromethyl)-s-triazine, 2-(2-methylthiophenyl)-4,6-bis(trichloromethyl)-s-triazine, 2-(4-methoxynaphthyl)-4,6-bis(trichloromethyl)-s-triazine, 2-(3-methoxynaphthyl)-4,6-bis(trichloromethyl)-s-triazine, 2-(2-methoxynaphthyl)-4,6-bis(trichloromethyl)-s-triazine, 2-(4-methoxy-β-styryl)-4,6-bis(trichloromethyl)-s-triazine, 2-(3-methoxy-β-styryl)-4,6-bis(trichloromethyl)-s-triazine, 2-(2-methoxy-β-styryl)-4,6-bis(trichloromethyl)-s-triazine, 2-(3,4,5-trimethoxy-β-styryl)-4,6-bis (trichloromethyl)-s-triazine, 2-(4-methylthio-β-styryl)-4,6-bis (trichloromethyl)-s-triazine, 2-(3-methylthio-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis (trichloromethyl)-s-triazine, and 2-[2-(4-diethylamino-2-methylphenyl)ethenyl]-4,6-bis (trichloromethyl)-s-triazine.

Illustrative examples of the above diaryl iodonium salts include diphenyl iodonium tetrafluoroborate, diphenyl iodonium hexafluorophosphonate, diphenyl iodonium hexafluoroarsenate, diphenyl iodonium trifluoromethane sulfonate, diphenyl iodonium trifluoroacetate, diphenyl iodonium-p-toluene sulfonate, 4-methoxyphenylphenyl iodonium tetrafluoroborate, 4-methoxyphenylphenyl iodonium hexafluorophosphonate, 4-methoxyphenylphenyl iodonium hexafluoroarsenate, 4-methoxyphenylphenyl iodonium trifluoromethane sulfonate, 4-methoxyphenylphenyl iodonium trifluoroacetate, 4-methoxyphenylphenyl iodonium-p-toluene sulfonate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, and bis(4-tert-butylphenyl)iodonium-p-toluene sulfonate.

Illustrative examples of the above triaryl sulfonium salts include triphenyl sulfonium tetrafluoroborate, triphenyl sulfonium hexafluorophosphonate, triphenyl sulfonium hexafluoroarsenate, triphenyl sulfonium trifluoromethane sulfonate, triphenyl sulfonium trifluoroacetate, triphenyl sulfonium-p-toluene sulfonate, 4-methoxyphenyldiphenyl sulfonium tetrafluoroborate, 4-methoxyphenyldiphenyl sulfonium hexafluorophosphonate, 4-methoxyphenyldiphenyl sulfonium hexafluoroarsenate, 4-methoxyphenyldiphenyl sulfonium trifluoromethane sulfonate, 4-methoxyphenyldiphenyl sulfonium trifluoroacetate, 4-methoxyphenyldiphenyl sulfonium-p-toluene sulfonate, 4-phenylthiophenyldiphenyl tetrafluoroborate, 4-phenylthiophenyldiphenyl hexafluorophosphonate, 4-phenylthiophenyldiphenyl hexafluoroarsenate, 4-phenylthiophenyldiphenyl trifluoromethane sulfonate, 4-phenylthiophenyldiphenyl trifluoroacetate, and 4-phenylthiophenyldiphenyl-p-toluene sulfonate.

Of these compounds, 2-(3-chlorophenyl)-4,6-bis(trichloromethyl)-s-triazine, 2-(4-methoxyphenyl)-4,6-bis(trichloromethyl)-s-triazine, 2-(4-methylthiophenyl)-4,6-bis (trichloromethyl)-s-triazine, 2-(4-methoxy-β-styryl)-4,6-bis (trichloromethyl)-s-triazine, 2-piperonyl-4,6-bis (trichloromethyl)-s-triazine, 2-[2-(furan-2-yl)ethenyl]-4,6-bis(trichloromethyl)-s-triazine, 2-[2-(5-methylfuran-2-yl) ethenyl]-4,6-bis (trichloromethyl)-s-triazine, 2-[2-(4-diethylamino-2-methylphenyl)ethenyl]-4,6-bis (trichloromethyl)-s-triazine and 2-(4-methoxynaphthyl)-4, 6-bis(trichloromethyl)-s-triazine are preferred as the trichloromethyl-s-triazines; diphenyl iodonium trifluoroacetate, diphenyl iodonium trifluoromethane sulfonate, 4-methoxyphenylphenyl iodonium trifluoromethane sulfonate and 4-methoxyphenylphenyl iodonium trifluoroacetate are preferred as the diaryl iodonium salts; and triphenyl sulfonium trifluoromethane sulfonate, triphenyl sulfonium trifluoroacetate, 4-methoxyphenyldiphenyl sulfonium trifluoromethane sulfonate, 4-methoxyphenyldiphenyl sulfonium trifluoroacetate, 4-phenylthiophenyldiphenyl trifluoromethane sulfonate and 4-phenylthiophenyldiphenyl trifluoroacetate are preferred as the triaryl sulfonium salts.

The component (IB) is preferably used in an amount of 0.001 to 30 parts by weight, more preferably 0.01 to 10 parts by weight, based on 100 parts by weight of the component (IA).

When the amount of the component (IB) is smaller than 0.001 parts by weight based on 100 parts by weight of the component (IA), the amount of acids generated when subjected to irradiation of radiation is so small that crosslinking of the molecules of the component (IA) does not proceed to a satisfactory extent, so that a film remaining rate after a development treatment and the heat resistance, chemical resistance and adhesion to a substrate of a pattern to be obtained may be low. On the other hand, when the amount of the component (IB) is larger than 30 parts by weight based on 100 parts by weight of the component (IA), unsatisfactory formability of a pattern may result.

Component (IC)

The crosslinkable compound (IC) is a compound having, in a molecule, at least one group (hereinafter referred to as "crosslinkable group") which can be crosslinked by the action of an acid generated from the above component (IB).

Illustrative examples of this crosslinkable group include an amino group, an alkoxyalkyl group and an epoxy group. Specific examples of an alkoxymethyl group include a methoxymethyl group, an ethoxybutyl group, a propoxybutyl group, a butoxymethyl group and a t-butoxymethyl group.

Illustrative examples of a compound containing at least one amino group and/or alkoxyalkyl group in a molecule include a melamine resin, a benzoguanamine resin, a glycol uryl resin, an urea resin, an alkoxymethylated melamine resin, an alkoxymethylated benzoguanamine resin, an alkoxymethylated glycol uryl resin and an alkoxymethylated urea resin.

The above alkoxymethylated melamine resin, alkoxymethylated benzoguanamine resin, alkoxymethylated glycol uryl resin and alkoxymethylated urea resin can be obtained by converting methylol groups in a methylolated melamine resin, a methylolated benzoguanamine resin, a methylolated glycol uryl resin and a methylolated urea resin into an alkoxymethyl group, respectively. The type of the alkoxymethyl group is not particularly limited, and illustrative examples thereof include a methoxymethyl group, an ethoxymethyl group, a propoxymethyl group, a butoxymethyl group and a t-butoxymethyl group.

As commercial products of such compounds, Cymel 300, 301, 303, 370, 325, 327, 701, 266, 267, 238, 1141, 272, 202, 1156, 1158, 1123, 1170, 1174, UFR65 and 300 (products of Mitsui Cyanamid Co., Ltd.) and Nikalac Mx-750, Mx-032, Mx-706, Mx-708, Mx-40, Mx-31, Ms-11 and Mw-30 (products of Sanwa Chemical Co., Ltd.) can be preferably used.

As a compound containing at least one epoxy group in a molecule, a compound containing two or more epoxy groups in a molecule is preferred. Specific examples thereof include a bisphenol A type epoxy resin, a bisphenol F type epoxy resin, a phenol novolak type epoxy resin, a cresol novolak type epoxy resin, an alicyclic epoxy resin and an aliphatic polyglycidyl ether.

Illustrative examples of commercial products of the bisphenol A type epoxy resin include EPIKOTE 1001, 1002, 1003, 1004, 1007, 1009, 1010 and 828 (products of Japan Epoxy Resins Co., Ltd.). Illustrative examples of commercial products of the bisphenol F type epoxy resin include EPIKOTE 807 (product of Japan Epoxy Resins Co., Ltd.). Illustrative examples of commercial products of the phenol novolak type epoxy resin include EPIKOTE 152 and 154 (products of Japan Epoxy Resins Co., Ltd.) and EPPN 201 and 202 (products of Nippon Kayaku Co., Ltd.). Illustrative examples of commercial products of the cresol novolak type epoxy resin include EOCN-102, EOCN-103S, EOCN-104S, EOCN-1020, EOCN-1025 and EOCN-1027 (products of Nippon Kayaku Co., Ltd.) and EPIKOTE 180S75 (product of Japan Epoxy Resins Co., Ltd.). Illustrative examples of commercial products of the alicyclic epoxy resin include CY175, CY177 and CY179 (products of CIBA-GEIGY AG), ERL-4234, ERL-4299, ERL-4221 and ERL-4206 (products of U. C. C.), SHODINE 509 (product of Showa Denko Co., Ltd.), ARALDITE CY-182, CY-192 and CY-184 (products of CIBA-GEIGY AG), EPICLON 200 and 400 (products of DAINIPPON INK AND CHEMICALS, INC.), EPIKOTE 871 and 872 (products of Japan Epoxy Resins Co., Ltd.) and ED-5661 and ED-5662 (products of Celanese Coating Co., Ltd.). Illustrative examples of commercial products of the aliphatic polyglycidyl ether include EPO-LIGHT 100MF (product of KYOEISHA CHEMICAL CO., LTD.) and EPIOL TMP (product of NOF Corporation).

In addition to the above compounds, glycidyl ether of bisphenol A or bisphenol F can also be suitably used.

Of these compounds, the alkoxymethylated melamine resin, alkoxymethylated benzoguanamine resin, bisphenol A type epoxy resin, phenol novolak type epoxy resin and cresol novolak type epoxy resin are preferred.

These crosslinkable compounds can be used alone or in combination of two or more.

When an epoxy-group-containing unsaturated monomer is used as the monomer (a-3) constituting the component (IA), the component (IA) can also be called "crosslinkable compound". However, the component (IA) differs from the component (IC) in that the component (IA) contains a substantial amount of fluorine and has alkali solubility.

The component (IC) is preferably used in an amount of 1 to 100 parts by weight, more preferably 5 to 50 parts by weight, based on 100 parts by weight of the component (IA).

When the amount of the component (IC) is smaller than 1 part by weight based on 100 parts by weight of the component (IA), crosslinking of the system does not proceed to a satisfactory degree, so that pattern formation itself may be difficult to carry out successfully. On the other hand, when the amount of the component (IC) is larger than 100 parts by weight based on 100 parts by weight of the component (IA), the film remaining rate after the development treatment is liable to lower.

Component (ID)

Specific examples of the component (ID) which is a fluorine-containing organic compound other than the component (IA) include a perfluoroalkylsulfonic acid, a perfluoroalkylcarboxylic acid, a perfluoroalkylalkylene oxide adduct, a perfluoroalkyltrialkyl ammonium salt, an oligomer containing a perfluoroalkyl group and a hydrophilic group, an oligomer containing a perfluoroalkyl group and a lipophilic group, an oligomer containing a perfluoroalkyl group, a hydrophilic group and a lipophilic group, an urethane containing a perfluoroalkyl group and a hydrophilic group, a perfluoroalkyl ester, a perfluoroalkylphosphate, methyl trifluorosilane, trimethyl fluorosilane, trifluoromethyl trimethylsilane, (3,3,3-trifluoropropyl)dimethyl chlorosilane, 3-(heptaflubroisopropoxy)propyl trichlorosilane, 3-(3,3,3-trifluoropropyl)heptamethyl trisilane, and (3,3,3-trifluoropropyl)trimethoxysilane.

Of these, the perfluoroalkylcarboxylic acid and (3,3,3-trifluoropropyl)trimethoxysilane are preferred.

As commercial products of such compounds, those with trade names such as MEGAFAC F116, F120, F142D, F144D, F150, F160, F171, F172, F173, F177, F178A, F178RM, F178K, F179, F183, F184, F191, F812, F815, F824, F833, DEFENSA MCF300, MCF310, MCF312 and MCF323 (products of DAINIPPON INK AND CHEMICALS, INC.), Florade FC430 and FC431 (products of SUMITOMO 3M Ltd.), ASAHIGUARD AG710, SURFLON S-382, SC-101, SC-102, SC-103, SC-104, SC-105 and SC-106 (products of ASAHI GLASS CO., LTD.), and FS1265 and AY43-158E (products of DOW CORNING TORAY SILICONE CO., LTD.) can be used.

These fluorine-containing organic compounds can be used alone or in combination of two or more.

In the present invention, the component (ID) is preferably used in an amount of 0.001 to 15 parts by weight, more preferably 0.01 to 10 parts by weight, based on 100 parts by weight of the component (IA). When the amount of the component (ID) is smaller than 0.001 parts by weight based on 100 parts by weight of the component (IA), the contact angle of a resin solution for the second coating film region to the first coating film region becomes so small that the resin solution for the second coating film region is liable to spread out of a region for the second coating film region. On the other hand, when the amount of the component (ID) is larger than 15 parts by weight based on 100 parts by weight of the component (IA), the film remaining rate after the development treatment may lower. Further, coatability may be degraded by the influence of generated foams.

When a bisphenol F type epoxy resin or glycidyl ether of bisphenol F is used as the component (IC), these can also be called "fluorine-containing organic compound other than the component (IA)". However, they are different from the component (ID) in that they have a crosslinkable group.

Other Components

The radiation sensitive resin composition of the present invention may contain a sensitizer. Illustrative examples of the sensitizer include flavones, dibenzalacetones, dibenzalcyclohexanes, chalcones, xanthenes, thioxanthenes, porphyrins, phthalocyanines, acridines, anthracenes, benzophenones, acetophenones, and coumarins having a substituent at the position 3 and/or the position 7.

The sensitizer is preferably used in an amount of not larger than 30 parts by weight, more preferably 0.1 to 20 parts by weight, based on 100 parts by weight of the component (IA).

Further, the radiation sensitive resin composition of the present invention may contain a surfactant other than a fluorine-based surfactant so as to improve coatability (for example, to prevent striation) and to improve developability.

Illustrative examples of the surfactant other than fluorine-based surfactants include nonionic surfactants, e.g., polyoxyethylene alkyl ethers such as a polyoxyethylene lauryl ether, polyoxyethylene stearyl ether and polyoxyethylene oleyl ether, polyoxyethylene aryl ethers such as a polyoxyethylene octylphenyl ether and polyoxyethylene nonylphenyl ether, and polyethylene glycol dialkyl esters such as a polyethylene glycol dilaurate and polyethylene glycol distearate; and other surfactants which are commercially available under trade names such as organosiloxane polymer KP341 (product of Shin-Etsu Chemical Co., Ltd.) and acrylic acid or methacrylic acid based (co)polymer POLYFLOW Nos. 57 and 95 (products of Kyoei Yushi Kagaku Kogyo Co., Ltd.).

These surfactants other than fluorine-based surfactants are preferably used in an amount of not larger than 2 parts by weight, more preferably not larger than 1 part by weight, based on 100 parts by weight of solids in the composition.

The radiation sensitive resin composition of the present invention may also contain an adhesive aid such as a silane coupling agent so as to improve adhesion to a substrate and an unsaturated compound such as a polyvalent acrylate so as to improve heat resistance.

In addition, the radiation sensitive resin composition of the present invention may also contain an antistatic agent, a storage stabilizer, a halation inhibitor, an antifoaming agent, a pigment, a thermally acid generating agent and the like as required.

Preparation of Radiation Sensitive Resin Composition

The radiation sensitive resin composition of the present invention is prepared by uniformly mixing the copolymer (IA), the acid generating compound (IB) which generates acid when irradiated with radiation, the crosslinkable compound (IC), the fluorine-containing organic compound (ID) other than the component (IA), and other components which are optionally added. The radiation sensitive resin composition of the present invention is preferably dissolved in a proper solvent and used in the state of solution. For example, the radiation sensitive resin composition in the state of solution can be prepared by adding given amounts of the components (IA) to (ID) and the optionally added components to an appropriate solvent and mixing them together.

As the solvent used to prepare the radiation sensitive resin composition of the present invention, a solvent which uniformly dissolves the components (IA) to (ID) and the optionally added components and does not react with the components is preferably used.

As the solvent for preparing the composition solution, the same solvents as those presented as examples of the polymerization solvent used to produce the above fluorine-containing copolymer can be used.

Further, if required, a high boiling point solvent such as benzyl ethyl ether, dihexyl ether, diethylene glycol monomethyl ether, diethylene glycol monoethyl ether, diethylene glycol monobutyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate or carbitol acetate may also be added.

The amount of the solvent used in the present invention is not particularly limited and may be changed as appropriate according to the type of substrate to be used and a desired film thickness. The total amount of the components (IA) to (ID) and the optionally added components in the composition solution is 5 to 60 parts by weight, preferably 10 to 50 parts by weight, more preferably 20 to 40 parts by weight, for example.

The composition solution prepared as described above can be used after filtered with a filter having openings of about 0.2 to 10 μm in size.

Formation of First Coating Film Region

Next, the steps (1) to (3) for forming the first coating film region by use of the radiation sensitive resin composition of the present invention will be described.

In the step (1), the radiation sensitive resin composition of the present invention is applied to a surface of a substrate which is then preferably prebaked to remove a solvent, thereby forming a coating film.

As the above substrate, glass, silicon, polycarbonate, polyester, aromatic polyamide, polyamide imide or polyimide can be used, for example.

As a method for applying the above radiation sensitive resin composition to the surface of the substrate, a variety of methods including a spray coating method, a roll coating method, a spin coating method, an ink-jet method and a slit method can be employed.

Although conditions for the above prebaking vary according to the types and amounts of the components, the conditions may be 50 to 150° C. and about 0.5 to 10 minutes, for example.

The film thickness after the prebaking may be any appropriate value according to the application purpose of a refractive index pattern to be formed. For example, it is 0.3 to 15 μm, preferably 0.5 to 10 μm.

Then, in the step (2), a portion of the coating film is irradiated with radiation such as visible light, ultraviolet light, far ultraviolet light, an electron beam or an X-ray via a pattern mask so as to form an exposed coating film. As the radiation, radiation including a wavelength of 190 to 450 nm is preferably used, and radiation (ultraviolet radiation) including a wavelength of 365 nm is more preferred.

The exposure dose is 1 to 10,000 $J/m^2$, preferably 100 to 5,000 $J/m^2$, particularly preferably 100 to 3,000 $J/m^2$, for example.

Then, a post-exposure baking treatment (PEB treatment) may be carried out as appropriate. The PEB treatment can be carried out at a temperature of 70 to 160° C., preferably 80 to 140° C., more preferably 90 to 110° C., for 0.5 to 30 minutes, preferably 1 to 10 minutes, more preferably 1 to 5 minutes, for example.

Then, in the step (3), the exposed coating film is developed with a developer, and unnecessary portions are removed so as to form a given pattern. The development method may be any of methods such as a liquid piling method, a dipping method and a showering method, and the development time is 10 to 300 seconds, for example.

As the above developer, an alkali aqueous solution, as exemplified by an aqueous solution of an inorganic alkali such as sodium hydroxide, potassium hydroxide, sodium carbonate, sodium silicate, sodium metasilicate or ammonia; a primary amine such as ethylamine or n-propylamine; a secondary amine such as diethylamine or di-n-propylamine; a tertiary amine such as trimethylamine, methyl die thylamine, dimethyl ethylamine or triethylamine; a tertiary ethanolamine such as dimethyl ethanolamine, methyl diethanolamine or triethanolamine; a cyclic tertiary amine such as pyrrole, piperidine, N-methyl piperidine, N-methyl pyrrolidine, 1,8-diazabicyclo[5.4.0]-7-undecene or 1,5-diazabicyclo[4.3.0]-5-nonene; an aromatic tertiary amine such as pyridine, collidine, lutidine or quinoline; or a quaternary ammonium salt such as tetramethylammonium hydroxide or tetraethylammonium hydroxide, can be used. Further, aqueous solutions prepared by adding a proper amount of a water-soluble organic solvent such as methanol or ethanol and/or a surfactant to the above alkali aqueous solutions can also be used as the developer.

After the development, the resulting coating film is preferably rinsed with running water for 30 to 90 seconds and then air-dried by compressed air or compressed nitrogen.

Thereafter, a postbaking treatment can be carried out as required. The postbaking treatment can be carried out by use of a heating device such as a hot plate or an oven at a predetermined temperature, e.g., 150 to 250° C., for a predetermined time, e.g., 5 to 30 minutes on a hot plate or 30 to 90 minutes in an oven.

The first coating film region formed as described above has a large contact angle to the resin solution used in the step (4). This contact angle varies according to the types and concentrations of a resin and solvent to be used and can be evaluated based on contact angles to three kinds of compounds, i.e., water, methylene iodide and n-hexadecane.

The first coating film region in the present invention can have a contact angle to water of 80° or larger, preferably 90° or larger, more preferably 100° or larger, for example. Further, the first coating film region can have a contact angle to methylene iodide of 50° or larger, preferably 60° or larger, more preferably 70° or larger, for example. In addition, the first coating film region can have a contact angle to n-hexadecane of 20° or larger, preferably 30° or larger, more preferably 40° or larger, for example.

The contact angle can be measured by use of a commercial goniometer or the like.

Further, the falling angle of the resin solution, that is, the angle at which droplets of the resin solution dropped on the first coating film region in the horizontal position start to move as the coating film is inclined, is small. This falling angle also varies according to the type of a solution to be used and can be evaluated based on the falling angles of water and toluene.

The first coating film region in the present invention can have a falling angle of water of 70° or smaller, preferably 65° or smaller, for example. Further, the first coating film region can have a falling angle of toluene of 20° or smaller, preferably 10° or smaller, for example.

Resin Solution

The resin solution to be used in the step (4) is a resin solution (hereinafter simply referred to as "high refractive index resin solution") prepared by dissolving a resin (hereinafter simply referred to as "high refractive index resin") having a higher refractive index than the refractive index of the first coating film region in a solvent having low wettability to the first coating film region.

The components of the high refractive index resin solution are selected such that the refractive index after the solution is formed into a film is 1.6 or higher, preferably 1.7 or higher, more preferably 1.8 or higher.

Illustrative examples of the high refractive index resin include an acrylic resin, urethane resin, polyester resin, polycarbonate resin, norbornene resin, styrene resin, polyether sulfone resin, silicon resin, polyamide resin, polyimide resin, polysiloxane resin, fluorine resin, polybutadiene resin, vinyl ether resin and vinyl ester resin. A preferable high refractive index resin solution can be selected and used, depending on the refractive index of the first coating film region. In particular, resin components including aromatics, halogen atoms and a sulfur atom may be suitably used for the purpose of achieving a large difference in refractive index between the first coating film region and the resin solution.

Specific examples of the resin components include the following polymers, with the numbers in parentheses representing the values of refractive indices by the d radiation; that is, a poly(2-aminoethyl methacrylate) (1.54), polyfurfuryl methacrylate (1.54), polybutyl mercaptyl methacrylate (1.54), poly(1-phenyl-n-amyl methacrylate) (1.54), poly(N-methyl-methacrylamide) (1.54), cellulose (1.54), polyvinyl chloride (1.54 to 1.55), urea formaldehyde resin (1.54 to 1.56), poly(sec-butylα-bromoacrylate) (1.54), poly(cyclohexylα-bromoacrylate) (1.54), poly(2-bromoethyl methacrylate) (1.54), polydihydroabietic acid (1.54), polyabietic acid (1.546), polymethylphenylsilsesquioxane (methyl/phenyl=¼) (1.55), polyethyl mercaptyl methacrylate (1.55), poly(N-allyl methacrylamide) (1.55), poly(1-phenylethyl methacrylate) (1.55), polyvinyl furan (1.55), poly(2-vinyl tetrahydrofuran) (1.55), poly(vinyl chloride)+40% tricresyl phosphate (1.55), poly(p-methoxybenzyl methacrylate) (1.55), polyisopropyl methacrylate (1.55), poly(p-isopropyl styrene) (1.55), polychloroprene (1.55 to 1.56), polyphenyl-silsesquioxane (1.56), poly(oxyethylene-α-benzoate-ω-methacrylate) (1.56), poly(p,p'-xylylenyl dimethacrylate) (1.56), poly(1-phenylallyl methacrylate) (1.56), poly(p-cyclohexylphenyl methacrylate) (1.56), poly(2-phenylethyl methacrylate) (1.56), poly(oxycarbonyloxy-1,4-phenylene-1-propyl) (1.56), poly(1-(o-chlorophenyl)ethyl methacrylate) (1.56), styrene-maleic anhydride copolymer (1.56), poly(1-phenylcylohexyl methacrylate) (1.56), poly(oxycarbonyloxy-1,4-phenylene-1,3-dimethyl-butylidene-1,4-phenylene) (1.57), poly(methylα-bromoacrylate) (1.57), polybenzyl methacrylate (1.57), poly(2-(phenylsulfonyl)ethyl methacrylate) (1.57), poly(m-cresyl methacrylate) (1.57), styrene-acrylonitrile copolymer (about 75/25) (1.57), poly(oxycarbonyloxy-1,4-phenyleneisobutylidene-1,4-phenylene) (1.57), poly(o-methoxyphenyl methacrylate) (1.57), polyphenyl methacrylate (1.57), poly(o-cresyl methacrylate) (1.57), polydiallyl phthalate (1.57), poly(2,3-dibromopropyl methacrylate) (1.57), poly(oxycarbonyloxy-1,4-phenylene-1-methyl-butylidene-1,4-phenylene) (1.57), poly(oxy-2,6-dimethylphenylene) (1.58), polyoxyethyleneoxyterephthaloyl (amorphous) (1.58), polyethylene terephthalate (1.51 to 1.64), polyvinyl benzoate (1.58), poly(oxycarbonyloxy-1,4-phenylenebutylidene-1,4-phenylene) (1.58), poly(1,2-diphenylethyl methacrylate) (1.58), poly(o-chlorobenzyl methacrylate) (1.58), poly(oxycarbonyloxy-1,4-phenylene-sec-butylidene-1,4-phenylene) (1.58), polyoxypentaerythritoloxyphthaloyl (1.58), poly(m-nitrobenzyl methacrylate) (1.58), poly(oxycarbonyloxy-1,4-phenyleneisopropylidene-1,4-phenylene) (1.59), poly(N-(2-phenylethyl)methacrylamide) (1.59), poly(4-methoxy-2-methylstyrene) (1.59), poly(o-methylstyrene) (1.59), polystyrene (1.59), poly(oxycarbonyloxy-1,4-phenylenecyclohexylidene-1,4-phenylene) (1.59), poly(o-methoxystyrene) (1.59), polydiphenylmethyl methacrylate (1.59), poly(oxycarbonyloxy-1,4-phenyleneethylidene-1,4-phenylene) (1.59), poly(p-bromophenyl methacrylate) (1.60), poly(N-benzyl methacrylamide) (1.60), poly(p-methoxystyrene) (1.60), polyvinylidene chloride (1.60 to 1.63), polysulfide ("Thiokol") (1.6 to 1.7), poly(o-chlorodiphenylmethyl methacrylate) (1.60), poly(oxycarbonyloxy-1,4-(2,6-dichloro) phenylene-isopropylidene-1,4-(2,6-dichloro) phenylene) (1.61), poly(oxycarbonyloxybis(1,4-(3,5-dichlorophenylene)) ), polypentachlorophenyl methacrylate (1.61), poly(o-chlorostyrene) (1.61), poly(phenylα-bromoacrylate) (1.61), poly(p-divinylbenzene) (1.62), poly(N-vinyl phthalimide) (1.62), poly(2,6-dichlorostyrene) (1.62), poly(β-naphthyl methacrylate) (1.63), poly(α-naphthyl-carbinyl methacrylate) (1.63), polysulfone (1.63), poly(2-vinyl thiophene) (1.64), poly(α-naphthyl methacrylate) (1.64), poly(oxycarbonyloxy-1,4-phenylenediphenyl-methylene-1,4-phenylene) (1.65), polyvinyl phenyl sulfide (1.66), butylphenol formaldehyde resin (1.66), urea-thio-urea-formaldehyde resin (1.66), polyvinyl naphthalene (1.68), polyvinyl carbazol (1.68), naphthalene-formaldehyde resin (1.70), phenol-formaldehyde resin (1.70), and polypentabromophenyl methacrylate (1.71).

The high refractive index resin components can be used alone or in admixture of two or more.

Further, the following inorganic oxide particles can be added so as to achieve a high refractive index. As the oxide particles, inorganic oxide particles can be used. The particles are preferably those which do not absorb light of a wavelength range used when the light passes through the particles and are optically highly transparent. As the refractive index of the oxide particles, the particles having a favorable value can be selected and used according to applications thereof.

As such oxide particles, oxides containing atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Bi and Te are suitably used. Preferred specific examples of the oxide particles include oxides such as BeO, MgO, CaO, SrO, BaO, $Sc_2O_3$, $Y_2O_3$, $La_2O_3$, $Ce_2O_3$, $Gd_2O_3$, $Tb_2O_3$, $Dy_2O_3$, $Yb_2O_3$, $Lu_2O_3$, $TiO_2$, $ZrO_2$, $HfO_2$, $Nb_2O_5$, $MoO_3$, $WO_3$, ZnO, $B_2O_3$, $Al_2O_3$, $SiO_2$, $GeO_2$, $SnO_2$, PbO, $Bi_2O_3$ and $TeO_2$; and complex oxides comprising the above oxides, such as $Al_2O_3$—MgO, $Al_2O_3$—$SiO_2$, ZnO—$Y_2O_3$, $ZrO_2$—$Ce_2O_3$, $ZrO_2$—$TiO_2$—$SnO_2$, $TeO_2$—Bao—ZnO, $TeO_2$—$WO_3$—$Ta_2O_5$, $TeO_2$—$WO_3$—$Bi_2O_3$, $TeO_2$—BaO—PbO, CaO—$Al_2O_3$, CaO—$Al_2O_3$—BaO, CaO—$Al_2O_3$—$Na_2O$, CaO—$Al_2O_3$—$K_2O$, CaO—$Al_2O_3$—$SiO_2$, PbO—$Bi_2O_3$—BaO, PbO—$Bi_2O_3$—ZnO, PbO—$Bi_2O_3$, PbO—$Bi_2O_3$—BaO—ZnO, PbO—$Bi_2O_3$—CdO—$Al_2O_3$, PbO—$Bi_2O_3$—$GeO_2$, PbO—$Bi_2O_3$—$GeO_2$—$Tl_2O$, BaO—PbO—$Bi_2O_3$, BaO—PbO—$Bi_2O_3$—ZnO, $Bi_2O_3$—$Ga_2O_3$—PbO, $Bi_2O_3$—$Ga_2O_3$—CdO and $Bi_2O_3$—$Ga_2O_3$—(Pb,Cd)O.

The particle diameters of the oxide particles are preferably smaller than the wavelength of visible light and can be, for example, 2 μm or smaller, more preferably 0.2 μm or smaller, particularly preferably 0.1 μm or smaller. When the particle diameter is larger than 2 μm, the transparency of refractive index pattern formed by the method of the present invention may lower or a problem may occur with respect to the surface conditions of the film.

The shape of the oxide particles is not particularly limited. However, nearly spherical oxide particles are preferably used because they hardly cause scattering of incident light.

Further, the above oxide particles can be brought into contact with, for example, a silane coupling agent, a surfactant or a coordinatable compound which can be coordinated to metal atoms constituting the oxide so as to be used as surface-modified particles.

The oxide particles can be used alone or in combination of two or more.

Further, when inorganic oxide particles are used, the resin component is preferably 10 to 90 parts by weight, more preferably 20 to 70 parts by weight, based on 100 parts by weight of the total of the inorganic oxide particles and the resin component. When the resin component is smaller than 10 parts by weight, a brittle cured film is liable to be obtained.

The solvent used in the high refractive index resin solution has a contact angle to the first coating film region of preferably 30° or larger, more preferably 45° or larger. Further, when a solvent which uniformly dissolves the above resin component and each component of other additives which are optionally added, uniformly disperses inorganic oxide particles and the inorganic oxide particles are used, the solvent which does not react with the components is used.

Specific examples of the solvent include alcohols such as methanol, ethanol, propanol, iso-propanol, butanol, ethylene glycol and propylene glycol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether, diethylene glycol dimethyl ether and diethylene glycol ethylmethyl ether; propylene glycol monoalkyl ethers such as propylene glycol methyl ether, propylene glycol ethyl ether, propylene glycol propyl ether, and propylene glycol butyl ether; propylene glycol alkyl ether acetates such as propylene glycol methyl ether acetate, propylene glycol ethyl ether acetate, propylene glycol propyl ether acetate, and propylene glycol butyl ether acetate; propylene glycol alkyl ether propionates such as propylene glycol methyl ether propionate, propylene glycol ethyl ether propionate, propylene glycol propyl ether propionate, and propylene glycol butyl ether propionate; aromatic hydrocarbons such as toluene and xylene; ketones such as methyl ethyl ketone, cyclohexanone, and 4-hydroxy-4-methyl-2-pentanone; esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate; and fluorine-atom-containing solvents such as trifluoromethyl benzene, 1,3-bis(trifluoromethyl) benzene, hexafluorobenzene, hexafluorocyclohexane, perfluorodimethylcyclohexane, perfluoromethylcyclohexane, octafluorodecalin, and 1,1,2-trichloro-1,2,2-trifluoroethane.

Of these solvents, alcohols, glycol ethers, ethylene glycol alkyl ether acetates, propylene glycol alkyl ether acetates, ketones, esters and diethyl glycols are preferably used in view of solubility, reactivities with the components and ease of formation of the coating film.

Further, high boiling point solvents can be used in combination with the above solvents. Illustrative examples of high boiling point solvents that can be used for this purpose include N-methyl formamide, N,N-dimethyl formamide, N-methyl formanilide, N-methyl acetamide, N,N-dimethyl acetamide, N-methyl pyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate.

The high refractive index resin solution may contain other additives. Illustrative examples of such additives include a surfactant, a heat resistance modifier, and an adhesive aid.

Illustrative examples of the surfactant include nonionic surfactants such as polyoxyethylene alkyl ethers, e.g., polyoxyethylene lauryl ether, polyoxyethylene stearyl ether and polyoxyethylene oleyl ether, polyoxyethylene aryl ethers, e.g., polyoxyethylene octylphenyl ether and polyoxyethylene nonylphenyl ether, and polyethylene glycol dialkyl esters, e.g., polyethylene glycol dilaurate and polyethylene glycol distearate; fluorine-based surfactants which are commercially available under trade names such as EFTOP EF301, EF303 and EF352 (products of Shin Akita Kasei Co., Ltd.), MEGAFAC F171, F172 and F173 (products of DAINIPPON INK AND CHEMICALS, INC.), Florade FC430 and FC431 (products of SUMITOMO 3M Ltd.), and ASAHIGUARD AG710 and SURFLON S-382, SC-101, SC-102, SC-103, SC-104, SC-105 and SC-106 (products of ASAHI GLASS CO., LTD.); and other surfactants which are commercially available under trade names such as organosiloxane polymer KP341 (product of Shin-Etsu Chemical Co., Ltd.) and acrylic acid or methacrylic acid based (co)polymer POLYFLOW Nos. 57 and 95 (products of Kyoei Yushi Kagaku Kogyo Co., Ltd.).

The surfactant is preferably used in an amount of 2 parts by weight or less, more preferably 1 part by weight, based on 100 parts by weight of the resin component.

Further, the above adhesive aid can be added so as to improve adhesion to a substrate, and a silane coupling agent or the like can be preferably used.

As the above heat resistance modifier, an unsaturated compound such as a polyvalent acrylate can be added.

In addition, the high refractive index resin solution used in the present invention may also contain an antistatic agent, a storage stabilizer, a halation inhibitor, an antifoaming agent, a pigment, a thermally acid generating agent and the like as required.

The amount of the solvent used is not particularly limited and may be changed as appropriate according to the type of substrate to be used and a desired film thickness. The amount of the solvent is such that the total content of the resin component, the inorganic oxide particles and the optionally added components in the resin solution is preferably 5 to 60 wt %, more preferably 10 to 50 wt %, much more preferably 20 to 40 wt %.

The resin solution prepared as described above can be used after filtered with a filter having openings of about 0.2 to 10 μm in size.

Formation of Second Coating Film Region

Next, the step (4) for forming the second coating film region by use of a high refractive index resin solution will be described.

A high refractive index resin solution prepared by the above method is applied to the patterned substrate, and the substrate is then preferably prebaked so as to remove the solvent, thereby forming the coating film.

As a method for applying the above high refractive index resin solution to the surface of the substrate, a variety of appropriate methods such as a spray coating method, a roll coating method, a spin coating method, an ink-jet method and a slit method can be employed.

Although conditions for the above prebaking vary according to the types and amounts of the components, the conditions may be 50 to 150° C. and about 0.5 to 10 minutes, for example.

The film thickness after the prebaking may be any appropriate value according to the application purpose of a pattern (hereinafter referred to as "refractive index pattern") to be formed which has two regions of different refractive indices. For example, it may be 0.3 to 15 μm, preferably 0.5 to 10 μm.

Thereafter, a postbaking treatment can be carried out. The postbaking treatment can be carried out by use of a heating device such as a hot plate or an oven at a given temperature, e.g., 150 to 250° C., for a given time, e.g., 5 to 30 minutes on a hot plate or 30 to 90 minutes in an oven.

EXAMPLES

Hereinafter, examples of the present invention will be described. However, the present invention is not limited to these examples.

Further, the number average molecular weight in terms of polystyrene of a polymer was measured by use of GPC chromatograph SYSTEM-21 of Showa Denko Co., Ltd. and tetrahydrofuran (THF) as a carrier solvent at a flow rate of 1 ml/min and 40° C.

[Synthesis Example of Component (IA)]

Synthesis Example 1

After a stainless autoclave having an internal volume of 0.5 liters and equipped with an electromagnetic stirrer was fully substituted with a nitrogen gas, 270 g of ethyl acetate, 22.5 g of ethyl vinyl ether (EVE), 40.3 g of crotonic acid (CA) and 5.4 g of lauroyl peroxide were charged into the autoclave which was then cooled to −50° C. in a dry ice-methanol bath, and oxygen in the system was then removed by a nitrogen gas again. Then, 117 g of hexafluoropropylene (HFP) was added, and the temperature started to be raised. The pressure when the internal temperature of the autoclave reached 70° C. was 8.3 kgf/cm². Thereafter, the reaction was continued under agitation at 70° C. for 12 hours, and the autoclave was water-cooled when the pressure was lowered to 7.0 kgf/cm² so as to terminate the reaction. After the temperature reached room temperature, unreacted monomers were discharged and the autoclave was opened, thereby obtaining a polymer solution having a solid concentration of 16.8%. After the obtained polymer solution was charged into water so as to precipitate the polymer, it was reprecipitated and purified with n-hexane and vacuum-dried at 50° C. so as to obtain 80 g of fluorine-containing copolymer (hereinafter, this resin will be referred to as "resin (1)").

As a result of measuring the number average molecular weight in terms of polystyrene of the obtained resin (1), it was 2,800.

Synthesis Example 2

After a stainless autoclave having an internal volume of 0.5 liters and equipped with an electromagnetic stirrer was fully substituted with a nitrogen gas, 270 g of diethylene glycol ethylmethyl ether (EDM), 10.7 g of ethyl vinyl ether (EVE), 47.4 g of crotonic acid (CA), 42.63 g of vinyl heptadecafluorononanoate and 5.4 g of lauroyl peroxide were charged into the autoclave which was then cooled to −50° C. in a dry ice-methanol bath, and oxygen in the system was then removed by a nitrogen gas again. Then, 118 g of hexafluoropropylene (HFP) was added, and the temperature started to be raised. The pressure when the internal temperature of the autoclave reached 70° C. was 8.5 kgf/cm². Thereafter, the reaction was continued under agitation at 70° C. for 12 hours, and the autoclave was water-cooled when the pressure was lowered to 8.1 kgf/cm² so as to terminate the reaction. After the temperature reached room temperature, unreacted monomers were discharged and the autoclave was opened, thereby obtaining a polymer solution having a solid concentration of 16.0%. After the obtained polymer solution was charged into water so as to precipitate the polymer, it was reprecipitated and purified with n-hexane and vacuum-dried at 50° C. so as to obtain 80 g of fluorine-containing copolymer (hereinafter, this resin will be referred to as "resin (2)").

As a result of measuring the number average molecular weight in terms of polystyrene of the obtained resin (2), it was 1,800.

Synthesis Example 3

After a stainless autoclave having an internal volume of 0.5 liters and equipped with an electromagnetic stirrer was fully substituted with a nitrogen gas, 270 g of ethyl acetate, 16.3 g of ethyl vinyl ether (EVE), 40.3 g of crotonic acid (CA), 19.7 g of heptafluorobutyl vinyl ether and 5.4 g of lauroyl peroxide were charged into the autoclave which was then cooled to −50° C. in a dry ice-methanol bath, and oxygen in the system was then removed by a nitrogen gas again. Then, 117 g of hexafluoropropylene (HFP) was added, and the temperature started to be raised. The pressure when the internal temperature of the autoclave reached 70° C. was 8.2 kgf/cm². Thereafter, the reaction was continued under agitation at 70° C. for 12 hours, and the autoclave was water-cooled when the pressure was lowered to 7.5 kgf/cm² so as to terminate the reaction. After the temperature reached room temperature, unreacted monomers were discharged and the autoclave was opened, thereby obtaining a polymer solution having a solid concentration of 16.0%. After the obtained polymer solution was charged into water so as to precipitate the polymer, it was reprecipitated and purified with n-hexane and vacuum-dried at 50° C. so as to obtain 80 g of fluorine-containing copolymer (hereinafter, this resin will be referred to as "resin (3)").

As a result of measuring the number average molecular weight in terms of polystyrene of the obtained resin (3), it was 1,900.

Synthesis Example 4

After a stainless autoclave having an internal volume of 0.5 liters and equipped with an electromagnetic stirrer was fully substituted with a nitrogen gas, 270 g of ethyl acetate, 17.0 g of ethyl vinyl ether (EVE), 47.4 g of crotonic acid (CA) and 5.4 g of lauroyl peroxide were charged into the autoclave which was then cooled to −50° C. in a dry ice-methanol bath, and oxygen in the system was then removed by a nitrogen gas again. Then, 118 g of hexafluoropropylene (HFP) was added, and the temperature started to be raised. The pressure when the internal temperature of the autoclave reached 70° C. was 8.5 kgf/cm². Thereafter, the reaction was continued under agitation at 70° C. for 12 hours, and the autoclave was water-cooled when the pressure was lowered to 8.0 kgf/cm² so as to terminate the reaction. After the temperature reached room temperature, unreacted monomers were discharged and the autoclave was opened, thereby obtaining a polymer solution having a solid concentration of 16.2%. After the obtained polymer solution was charged into water so as to precipitate the polymer, it was reprecipitated and purified with n-hexane and vacuum-dried at 50° C. so as to obtain 80 g of fluorine-containing copolymer (hereinafter, this resin will be referred to as "resin (4)"). As a result of measuring the number average molecular weight in terms of polystyrene of the obtained resin (4), it was 2,000.

Synthesis Example 5

After a stainless autoclave having an internal volume of 0.5 liters and equipped with an electromagnetic stirrer was fully substituted with a nitrogen gas, 270 g of ethyl acetate, 34.2 g of ethyl vinyl ether (EVE), 27.2 g of crotonic acid (CA) and 5.4 g of lauroyl peroxide were charged into the autoclave which was then cooled to −50° C. in a dry ice-methanol bath, and oxygen in the system was then removed by a nitrogen gas again. Then, 119 g of hexafluoropropylene (HFP) was added, and the temperature started to be raised. The pressure when the internal temperature of the autoclave reached 70° C. was 7.6 kgf/cm². Thereafter, the reaction was continued under agitation at 70° C. for 12 hours, and the autoclave was water-cooled when the pressure was lowered to 6.3 kgf/cm² so as to terminate the reaction. After the temperature reached room temperature, unreacted monomers were discharged and the autoclave was opened, thereby obtaining a polymer solution having a solid concentration of 19.6%. After the obtained polymer solution was charged into water so as to precipitate the polymer, it was reprecipitated and purified with n-hexane and vacuum-dried at 50° C. so as to obtain 80 g of fluorine-containing copolymer (hereinafter, this resin will be referred to as "resin (5)").

As a result of measuring the number average molecular weight in terms of polystyrene of the obtained resin (5), it was 8,400.

Preparation Example 1

After 100 parts by weight of the resin (3), 5 parts by weight of 2-piperonyl-bis-4,6-(trichloromethyl)-s-triazine, 20 parts by weight of "Cymel 300" which is a hexamethoxymethylolmelamine resin and 1 part by weight of MEGAFAC F178RM (oligomer containing a perfluoroalkyl group and a lipophilic group; product of DAINIPPON INK AND CHEMICALS, INC.) were dissolved in diethylene glycol ethylmethyl ether as the components (IA), (IB), (IC) and (ID), respectively, in such amounts that the total content of the components (IA) to (ID) in the whole composition would be 40%, the resulting mixture was filtered with a membrane filter having openings of 0.2 μm in size, thereby preparing a radiation sensitive resin composition (hereinafter referred to as "radiation sensitive resin composition 1") as a solution.

Formation of Substrate (1) for Evaluation

After a glass substrate was coated with the solution of the radiation sensitive resin composition 1 by means of a spinner, the substrate was prebaked on a hot plate at 110° C. for 2 minutes so as to form a coating film having a thickness of 3.0 μm.

Then, an ultraviolet irradiation treatment was carried out on the obtained coating film at the optimum focal depth by use of NSR1505i6A reduced projection exposure equipment (product of Nikon Corporation, NA=0.45, λ=365 nm).

Then, the substrate was heated on a hot plate at 200° C. for 1 hour so as to form a substrate (1) for evaluation. The thickness of the cured film obtained from the radiation sensitive resin composition 1 on the substrate (1) was 2.7 μm.

Evaluation of Transparency

The transmittance of the substrate (1) was measured by use of a spectrophotometer "150-20 type double beam (product of Hitachi Ltd.)" at wavelengths of 400 to 800 nm. The lowest measured transmittance is shown in Table 1. When this value is higher than 95%, transparency is said to be excellent, when it is 90 to 95%, the transparency is said to be good, and when it is lower than 90%, the transparency is said to be poor.

Evaluation of Contact Angle 10 mg of water was dropped on the substrate (1), and the contact angle was measured by a contact angle meter (model "CA-X", product of Kyowa Interface Surface Co., Ltd.). The result is shown in Table 1. When this angle is 80° or larger, it is good.

Further, 20 mg of methylene iodide was dropped in place of water, and the contact angle was evaluated in the same manner as described above. The result is shown in Table 1. When this angle is 500 or larger, it is good.

In addition, 7 mg of n-hexadecane was dropped in place of water, and the contact angle was evaluated in the same manner as described above. The result is shown in Table 1. When this angle is 20° or larger, it is good.

Evaluation of Falling Angle

The substrate (1) was placed in a horizontal position, 10 mg of water was dropped thereon, and the substrate was inclined so as to measure the angle at which droplets started to move. The result is shown in Table 1. When this angle is 70° or smaller, it is good.

Further, 5 mg of toluene was dropped in place of water, and the falling angle was evaluated in the same manner as described above. The result is shown in Table 1. When this angle is 20° or smaller, it is good.

Formation of Substrate (2) for Evaluation

After a glass substrate was coated with the composition solution prepared above by use of a spinner, the substrate was prebaked on a hot plate at 110° C. for 2 minutes so as to form a coating film having a thickness of 3.0 μm.

Then, an ultraviolet irradiation treatment was carried out on the obtained coating film via a given pattern mask at the optimum focal depth by use of NSR1505i6A reduced projection exposure equipment (product of Nikon Corporation, NA=0.45, λ=365 nm). Then, the resulting coating film was subjected to a PEB treatment on a hot plate at 110° C. for 2 minutes. Then, the treated film was developed by use of a 0.5-wt % tetramethylammonium hydroxide aqueous solution at 25° C. for 1 minute, rinsed with water, and then dried.

Figure 1:
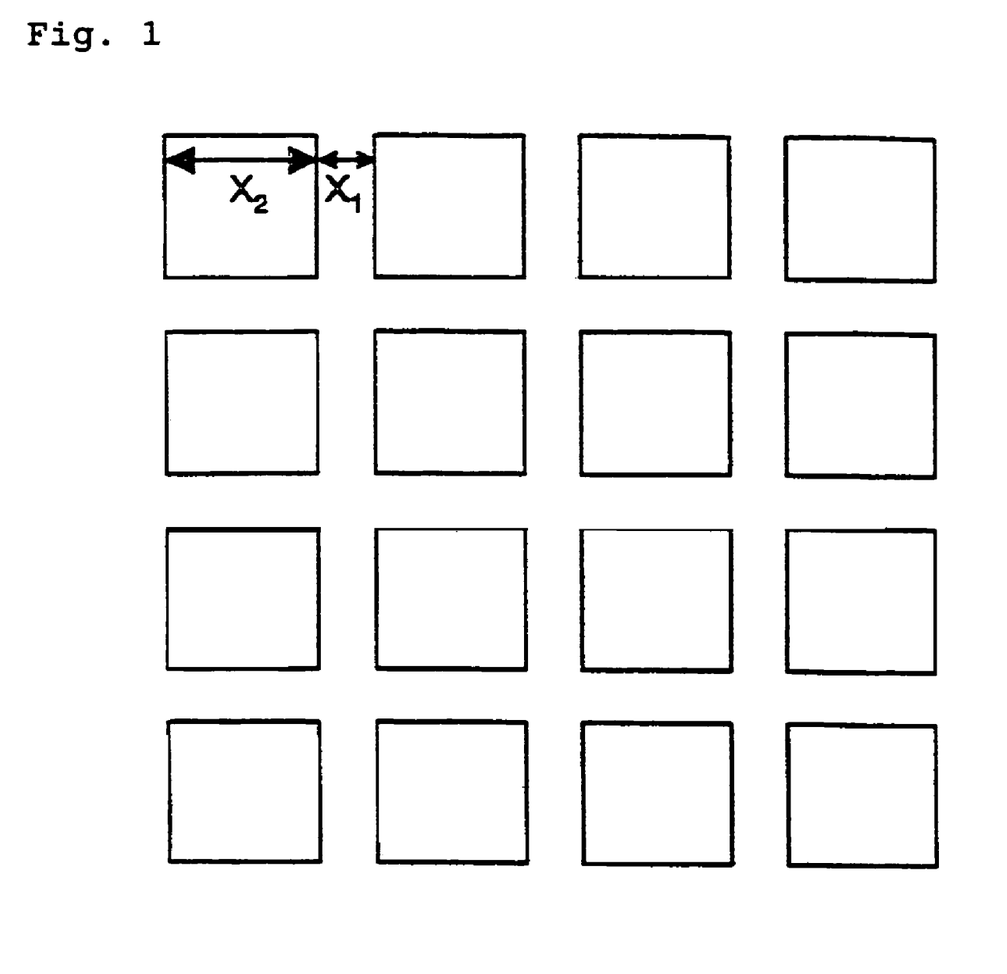
FIG. 1 is a schematic diagram showing the grid pattern of a substrate (2) for evaluation used in Examples.

Then, the dried film was heated on a hot plate at 200° C. for 1 hour so as to be postbaked, thereby forming, on the glass substrate, a first coating film region $A(X_2)$ of three types of patterns having a grid pattern $B(X1)$ and $A(X2)$ shown in FIG. 1, i.e., B(20 μm) and A(100 μm), B(10 μm) and A(50 μm), and B(5 μm) and A(25 μm).

Preparation Example 2

A radiation sensitive resin composition 2 was prepared and evaluated in the same manner as in Preparation Example 1 except that the resin (2) was used as the component (IA). The results are shown in Table 1.

Preparation Example 3

A radiation sensitive resin composition 3 was prepared and a cured film was formed and evaluated in the same manner as in Preparation Example 1 except that the resin (3) was used as the component (IA) and 3 parts by weight of AY43-158E (silicon-containing fluorine based surface modifier of Dow Corning Toray Silicone Co., Ltd.) was dissolved as the component (ID). The results are shown in Table 1.

Preparation Example 4

A radiation sensitive resin composition 4 was prepared and a cured film was formed and evaluated in the same manner as in Preparation Example 1 except that the resin (4) was used as the component (IA) and 3 parts by weight of perfluoroalkyl-group-containing oligomer (MEGAFAC F172 of DAINIPPON INK AND CHEMICALS, INC.) was dissolved as the component (ID). The results are shown in Table 1.

Preparation Example 5

A radiation sensitive resin composition 5 was prepared and a cured film was formed and evaluated in the same manner as in Preparation Example 1 except that the resin (5) was used as the component (IA) and 3 parts by weight of FS1265 (silicon-containing fluorine based surface modifier of Dow Corning Toray Silicone Co., Ltd.) was dissolved as the component (ID). The results are shown in Table 1.

Preparation Example 6

After 100 parts by weight of polystyrene (product of Aldrich Co., Ltd., Mw=200,000) as a resin component and 1 part by weight of Florade FC430 (product of SUMITOMO 3M Ltd.) as a surfactant were dissolved in diethylene glycol ethylmethyl ether such that the total content of solids in the whole composition would be 40%, the mixture was filtered with a membrane filter having openings of 0.2 μm in size, thereby preparing a high refractive index resin solution 1.

Preparation Example 7

A high refractive index resin solution 2 was prepared in the same manner as in Preparation Example 6 except that 300 parts by weight of $ZrO_2$ particles were added by a dispersion solution using 10 parts by weight of special polycarboxylic acid type polymer surfactant HOMOGENOL L-18 (product of Kao Corporation) as a dispersant and methyl propylene glycol was used as a solvent.

Preparation Example 8

A high refractive index resin solution 3 was prepared in the same manner as in Preparation Example 6 except that 300 parts by weight of $TiO_2$ particles were added by a dispersion solution using 20 parts by weight of polyethylene glycol-polypropylene glycol block copolymer PE-62 (product of Sanyo Chemical Industries, Ltd.) as a dispersant and methyl isobutyl ketone was used as a solvent.

Preparation Example 9

A high refractive index resin solution 4 was prepared in the same manner as in Preparation Example 6 except that 100 parts by weight of polyphenylsilsesquioxane (GR-950 of Showa Denko Co., Ltd.) was used as a resin component, 0.1 parts by weight of organosiloxane polymer KP341 (product of Shin-Etsu Chemical Co., Ltd.) was used as a surfactant and ethyl lactate was used as a solvent.

Preparation Example 10

A high refractive index resin solution 5 was prepared in the same manner as in Preparation Example 6 except that 300 parts by weight of $ZrO_2$ particles were added by a dispersion solution using 10 parts by weight of special polycarboxylic acid type polymer surfactant HOMOGENOL L-18 (product of Kao Corporation) as a dispersant and methyl propylene glycol was used as a solvent.

Preparation Example 11

A high refractive index resin solution 6 was prepared in the same manner as in Preparation Example 6 except that 300 parts by weight of $TiO_2$ particles were added by a dispersion solution using 20 parts by weight of polyethylene glycol-polypropylene glycol block copolymer PE-62 (product of Sanyo Chemical Industries, Ltd.) as a dispersant and butyl cellosolve was used as a solvent.

TABLE 1

| Preparation Example | Transparency | Contact Angle | | | Falling Angle | |
|---|---|---|---|---|---|---|
| | | Water | Methyl Iodide | n-hexadecane | Water | Toluene |
| 1 | 91% | 101° | 62° | 32° | 64° | 9° |
| 2 | 92% | 110° | 75° | 55° | 50° | 7° |
| 3 | 90% | 105° | 70° | 45° | 62° | 9° |
| 4 | 92% | 106° | 78° | 50° | 53° | 6° |
| 5 | 90% | 105° | 68° | 43° | 62° | 8° |

Example 1

After the substrate (2) for evaluation patterned by use of the solution of the radiation sensitive resin composition 1 was coated with the high refractive index resin solution 1 by means of a spinner at 1,000 revolutions/30 seconds, the substrate was prebaked on a hot plate at 90° C. for 2 minute so as to form a coating film having a thickness of 1.5 μm.

Figure 2:
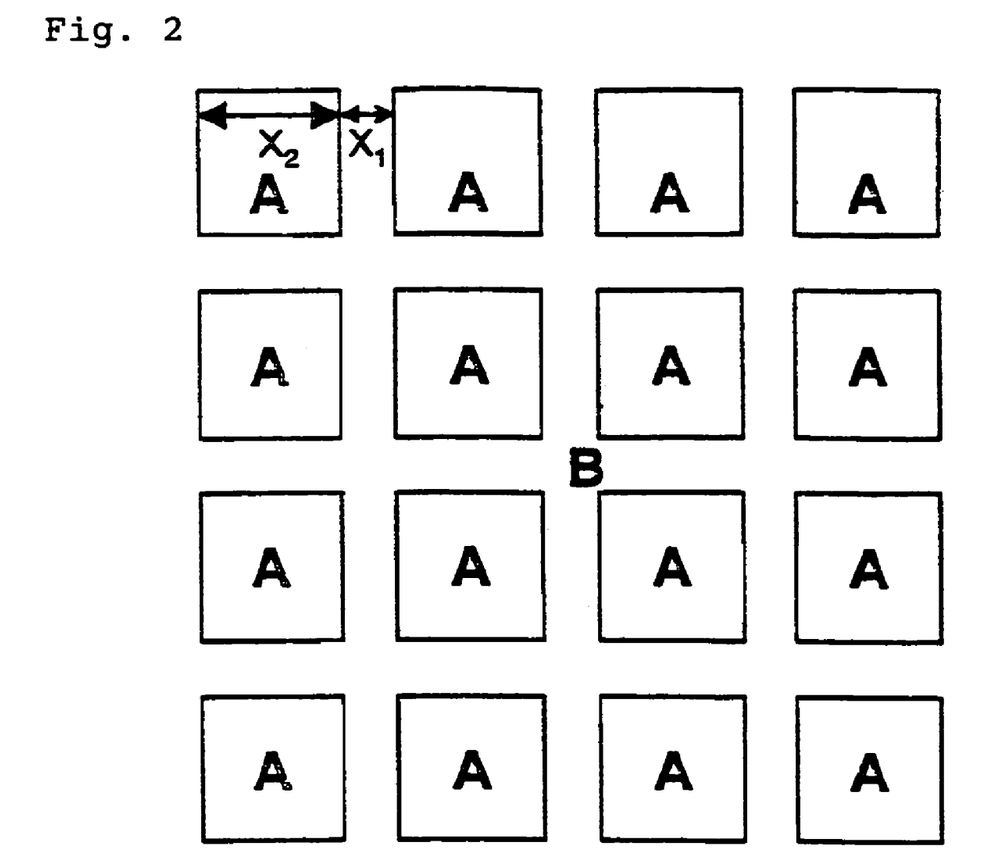
FIG. 2 is a schematic diagram showing a refractive index pattern prepared in Examples.

Then, the substrate was heated in an oven at 200° C. for 1 hour so as to form a substrate for evaluation coated as shown in FIG. 2. The cured film (second coating film region $B(X_1)$) of the high refractive index resin had a thickness of 1.3 μm.

Evaluation of Pixel Surface Uniformity

Figure 3:
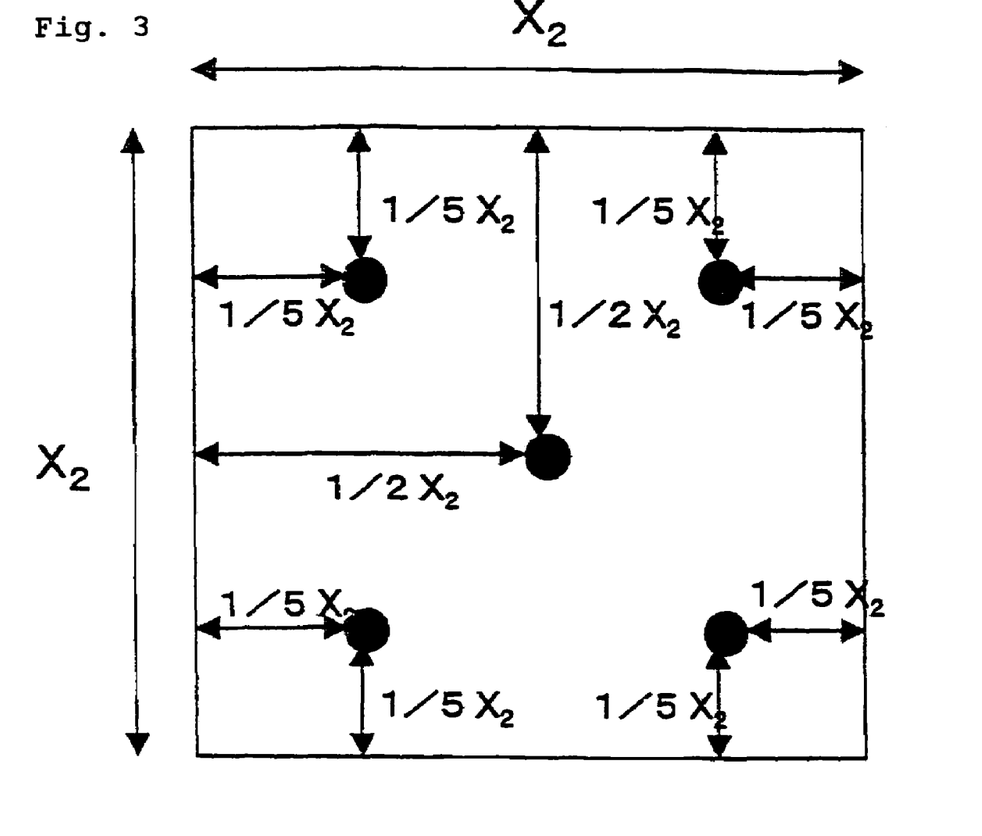
FIG. 3 is a schematic diagram showing 5 points for measuring a film thickness in a grid pattern whose side has a length of $X_2$.

The film thickness was measured at 5 different positions shown in FIG. 3 in the grid pattern of the first coating film region. A variation in the film thickness is shown in Table 2. When this value is less than 2%, pixel surface uniformity is said to be significantly excellent. When the value is 2% to less than 3%, the pixel surface uniformity is said to be excellent. When the value is 3% to less than 5%, the pixel surface uniformity is said to be good. When the value is 5% or more, the pixel surface uniformity is said to be poor. The results are shown in Table 2.

Confirmation of Coating through Observation by Electron Microscope

A cross section of the substrate for evaluation formed above was observed by a transmission electron microscope so as to confirm that the high refractive index resin was not coated on the grid matrix of the first coating film region shown in FIG. 2. When the high refractive index resin was not coated on the grid matrix, it was evaluated as "o", while when the high refractive index resin was coated on the grid matrix, it was evaluated as "x". The results are shown in Table 2.

Example 2

Evaluations were made in the same manner as in Example 1 except that the solution of the radiation sensitive resin composition 2 was used. The results are shown in Table 2.

Example 3

Evaluations were made in the same manner as in Example 1 except that the solution of the radiation sensitive resin composition 3 was used. The results are shown in Table 2.

Example 4

Evaluations were made in the same manner as in Example 1 except that the solution of the radiation sensitive resin composition 4 was used. The results are shown in Table 2.

Example 5

Evaluations were made in the same manner as in Example 1 except that the solution of the radiation sensitive resin composition 5 was used. The results are shown in Table 2.

Example 6

After the substrate (2) for evaluation patterned by use of the solution of the radiation sensitive resin composition 1 was coated with the high refractive index resin solution 2 by means of a spinner at 1,000 revolutions/30 seconds, the substrate was prebaked on a hot plate at 90° C. for 2 minute so as to form a coating film having a thickness of 1.4 μm.

Then, the substrate was heated in an oven at 200° C. for 1 hour, thereby forming a substrate for evaluation. The cured film of the high refractive index resin had a thickness of 1.3 μm. Evaluations were made in the same manner as in Example 1. The results are shown in Table 2.

Example 7

Evaluations were made in the same manner as in Example 6 except that the solution of the radiation sensitive resin composition 2 was used. The results are shown in Table 2.

Example 8

Evaluations were made in the same manner as in Example 6 except that the solution of the radiation sensitive resin composition 3 was used. The results are shown in Table 2.

Example 9

Evaluations were made in the same manner as in Example 6 except that the solution of the radiation sensitive resin composition 4 was used. The results are shown in Table 2.

Example 10

Evaluations were made in the same manner as in Example 6 except that the solution of the radiation sensitive resin composition 5 was used. The results are shown in Table 2.

Example 11

After the substrate (2) for evaluation patterned by use of the solution of the radiation sensitive resin composition 1 was coated with the high refractive index resin solution 3 by means of a spinner at 1,000 revolutions/30 seconds, the substrate was prebaked on a hot plate at 90° C. for 2 minute so as to form a coating film having a thickness of 1.6 μm.

Then, the substrate was heated in an oven at 200° C. for 1 hour, thereby forming a substrate for evaluation. The cured film of the high refractive index resin had a thickness of 1.5 μm. Evaluations were made in the same manner as in Example 1. The results are shown in Table 2.

Example 12

Evaluations were made in the same manner as in Example 11 except that the solution of the radiation sensitive resin composition 2 was used. The results are shown in Table 2.

Example 13

Evaluations were made in the same manner as in Example 11 except that the solution of the radiation sensitive resin composition 3 was used. The results are shown in Table 2.

Example 14

Evaluations were made in the same manner as in Example 11 except that the solution of the radiation sensitive resin composition 4 was used. The results are shown in Table 2.

Example 15

Evaluations were made in the same manner as in Example 11 except that the solution of the radiation sensitive resin composition 5 was used. The results are shown in Table 2.

Example 16

After the substrate (2) for evaluation patterned by use of the solution of the radiation sensitive resin composition 1 was coated with the high refractive index resin solution 4 by means of a spinner at 1,000 revolutions/30 seconds, the substrate was prebaked on a hot plate at 90° C. for 2 minute so as to form a coating film having a thickness of 1.4 μm.

Then, the substrate was heated in an oven at 200° C. for 1 hour, thereby forming a substrate for evaluation. The cured film of the high refractive index resin had a thickness of 1.2 μm. Evaluations were made in the same manner as in Example 1. The results are shown in Table 2.

Example 17

Evaluations were made in the same manner as in Example 16 except that the solution of the radiation sensitive resin composition 2 was used. The results are shown in Table 2.

Example 18

Evaluations were made in the same manner as in Example 16 except that the solution of the radiation sensitive resin composition 3 was used. The results are shown in Table 2.

Example 19

Evaluations were made in the same manner as in Example 16 except that the solution of the radiation sensitive resin composition 4 was used. The results are shown in Table 2.

Example 20

Evaluations were made in the same manner as in Example 16 except that the solution of the radiation sensitive resin composition 5 was used. The results are shown in Table 2.

Example 21

After the substrate (2) for evaluation patterned by use of the solution of the radiation sensitive resin composition 1 was coated with the high refractive index resin solution 5 by means of a spinner at 1,000 revolutions/30 seconds, the substrate was prebaked on a hot plate at 90° C. for 2 minute so as to form a coating film having a thickness of 1.3 μm.

Then, the substrate was heated in an oven at 200° C. for 1 hour, thereby forming a substrate for evaluation. The cured film of the high refractive index resin had a thickness of 1.2 μm. Evaluations were made in the same manner as in Example 1. The results are shown in Table 2.

Example 22

Evaluations were made in the same manner as in Example 21 except that the solution of the radiation sensitive resin composition 2 was used. The results are shown in Table 2.

Example 23

Evaluations were made in the same manner as in Example 21 except that the solution of the radiation sensitive resin composition 3 was used. The results are shown in Table 2.

Example 24

Evaluations were made in the same manner as in Example 21 except that the solution of the radiation sensitive resin composition 4 was used. The results are shown in Table 2.y

Example 25

Evaluations were made in the same manner as in Example 21 except that the solution of the radiation sensitive resin composition 5 was used. The results are shown in Table 2.

Example 26

After the substrate (2) for evaluation patterned by use of the solution of the radiation sensitive resin composition 1 was coated with the high refractive index resin solution 6 by means of a spinner at 1,000 revolutions/30 seconds, the substrate was prebaked on a hot plate at 90° C. for 2 minute so as to form a coating film having a thickness of 1.6 μm.

Then, the substrate was heated in an oven at 200° C. for 1 hour, thereby forming a substrate for evaluation. The cured film of the high refractive index resin had a thickness of 1.5 μm. Evaluations were made in the same manner as in Example 1. The results are shown in Table 2.

Example 27

Evaluations were made in the same manner as in Example 26 except that the solution of the radiation sensitive resin composition 2 was used. The results are shown in Table 2.

Example 28

Evaluations were made in the same manner as in Example 26 except that the solution of the radiation sensitive resin composition 3 was used. The results are shown in Table 2.

Example 29

Evaluations were made in the same manner as in Example 26 except that the solution of the radiation sensitive resin composition 4 was used. The results are shown in Table 2.

Example 30

Evaluations were made in the same manner as in Example 26 except that the solution of the radiation sensitive resin composition 5 was used. The results are shown in Table 2.

TABLE 2

| Shape of Pattern | | In-plane Uniformity | | | Coating without Superposed Coated Portions | | |
|---|---|---|---|---|---|---|---|
| $X_2$ (μm) | | 100 | 50 | 25 | 100 | 50 | 25 |
| $X_1$ (μm) | | 20 | 10 | 5 | 20 | 10 | 5 |
| Example 1 | | 1.30% | 1.80% | 7.50% | ○ | ○ | x |
| Example 2 | | 2.10% | 1.90% | 7.40% | ○ | ○ | x |
| Example 3 | | 1.60% | 2.10% | 6.70% | ○ | ○ | x |
| Example 4 | | 0.90% | 1.60% | 5.20% | ○ | ○ | x |
| Example 5 | | 1.90% | 1.90% | 4.60% | ○ | ○ | ○ |

TABLE 2-continued

| Shape of Pattern | | In-plane Uniformity | | | Coating without Superposed Coated Portions | | |
|---|---|---|---|---|---|---|---|
| | $X_2$ (μm) | 100 | 50 | 25 | 100 | 50 | 25 |
| | $X_1$ (μm) | 20 | 10 | 5 | 20 | 10 | 5 |
| Example 6 | | 2.50% | 3.80% | 7.90% | ○ | x | x |
| Example 7 | | 2.10% | 3.70% | 8.60% | ○ | x | x |
| Example 8 | | 2.60% | 3.20% | 9.60% | ○ | x | x |
| Example 9 | | 2.90% | 3.50% | 6.70% | ○ | ○ | x |
| Example 10 | | 2.20% | 2.80% | 6.80% | ○ | ○ | x |
| Example 11 | | 2.60% | 3.90% | 6.90% | ○ | x | x |
| Example 12 | | 2.40% | 3.90% | 6.60% | ○ | x | x |
| Example 13 | | 2.70% | 3.60% | 7.60% | ○ | ○ | x |
| Example 14 | | 3.00% | 3.70% | 5.70% | ○ | x | x |
| Example 15 | | 3.20% | 3.90% | 5.80% | ○ | x | x |
| Example 16 | | 1.00% | 1.50% | 3.50% | ○ | ○ | ○ |
| Example 17 | | 1.20% | 1.30% | 3.40% | ○ | ○ | ○ |
| Example 18 | | 1.10% | 2.00% | 3.80% | ○ | ○ | ○ |
| Example 19 | | 0.90% | 1.30% | 3.20% | ○ | ○ | ○ |
| Example 20 | | 0.90% | 1.90% | 3.60% | ○ | ○ | ○ |
| Example 21 | | 1.40% | 1.90% | 3.40% | ○ | ○ | ○ |
| Example 22 | | 1.90% | 1.40% | 3.70% | ○ | ○ | ○ |
| Example 23 | | 1.20% | 2.40% | 3.90% | ○ | ○ | ○ |
| Example 24 | | 1.90% | 1.20% | 3.60% | ○ | ○ | ○ |
| Example 25 | | 0.90% | 2.90% | 2.70% | ○ | ○ | ○ |
| Example 26 | | 1.30% | 3.30% | 3.40% | ○ | ○ | ○ |
| Example 27 | | 1.20% | 4.40% | 4.80% | ○ | x | x |
| Example 28 | | 1.10% | 3.50% | 4.90% | ○ | ○ | x |
| Example 29 | | 2.90% | 3.20% | 3.40% | ○ | ○ | ○ |
| Example 30 | | 0.90% | 4.90% | 4.90% | ○ | x | x |

According to the present invention, there are provided a method for forming two regions having different refractive indices by use of a water-shedding oil-shedding radiation sensitive resin composition, and optical materials formed by the method, such as microlenses and optical waveguides.

By use of the present invention, two distinct regions having different refractive indices can be coated and formed by a simple method, and a pattern in which a difference in refractive index between a high refractive index region and a low refractive index region is 0.1 or larger can be prepared easily due to broad range of electing materials to be used.

What is claimed is:

1. A method for forming a pattern having two regions of different refractive indices which comprises the steps of:
   (1) coating a substrate with a radiation sensitive resin composition, to form a coating film;
   (2) exposing a portion of the coating film to radiation to form an exposed coating film;
   (3) developing the exposed coating film to form a pattern comprising a first coating film region and a non-coating film region; and
   (4) coating the pattern with a resin solution prepared by dissolving a resin having a higher refractive index than that of the first coating film region in a solvent having low wettability to the first coating film region, thereby converting the non-coating film region into a second coating film region, to form two different refractive index regions which are the first coating film region and the second coating film region, wherein said resin having a higher refractive index than that of the first coating film region is selected from the group consisting of acrylic resin, urethane resin, polyester resin, polycarbonate resin, norbornene resin, styrene resin, polyether resin, silicon resin, polyamide resin, polyimide resin, polysiloxane resin, fluorine resin, polybutadiene resin, vinyl ether resin, and vinyl ester resin.

2. The method of claim 1, wherein the refractive index of the first coating film region is 1.5 or lower, and the refractive index of the second coating film region is from 1.6 to 1.71.

3. The method of claim 1, wherein the solvent of the resin solution has a contact angle to the first coating film region of 30° or larger.

* * * * *